United States Patent
Chang (10) Patent No.: US 7,763,416 B2
(45) Date of Patent: Jul. 27, 2010

(54) FABRICATION METHOD OF ACTIVE DEVICE ARRAY SUBSTRATE

(75) Inventor: Chia-Ming Chang, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 767 days.

(21) Appl. No.: 11/562,423

(22) Filed: Nov. 22, 2006

(65) Prior Publication Data
US 2008/0032235 A1    Feb. 7, 2008

(30) Foreign Application Priority Data
Aug. 4, 2006  (TW)  .............................. 95128593 A (51) Int. Cl.
*G03F 7/26*  (2006.01)
(52) U.S. Cl. ........................ 430/313; 430/316
(58) Field of Classification Search ................. 430/311, 430/313, 316
See application file for complete search history.

(56) References Cited

U.S. PATENT DOCUMENTS

| 2004/0125313 A1 | 7/2004 | Lim |
| 2005/0099579 A1 | 5/2005 | Yoo et al. |
| 2005/0142681 A1 | 6/2005 | Soh |

*Primary Examiner*—Kathleen Duda
(74) *Attorney, Agent, or Firm*—Jianq Chyun IP Office (57) ABSTRACT

A fabrication method of active device array substrate is disclosed. First, a substrate and a multi-tone mask are provided. Then, a gate electrode, a gate insulation layer, a channel material layer, a metal material layer and a photo resist layer are formed on the substrate sequentially. Next, the photoresist layer is patterned by the multi-tone mask to form a patterned photoresist layer having three kinds of thicknesses. The metal material layer and the channel material layer not covered by the patterned photoresist layer are removed such that the channel layer is formed. Then, the patterned photoresist layer is removed by a fist removing process, a second removing process, and a third removing process sequentially to form a source electrode, a drain electrode and a passivation layer. Finally, a pixel electrode is formed on the substrate.

13 Claims, 10 Drawing Sheets

FABRICATION METHOD OF ACTIVE DEVICE ARRAY SUBSTRATE

CROSS-REFERENCE TO RELATED APPLICATION

This application claims the priority benefit of Taiwan application serial no. 95128593, filed Aug. 4, 2006. All disclosure of the Taiwan application is incorporated herein by reference.

BACKGROUND OF THE INVENTION

1. Field of the Invention

The present invention relates to a method of fabricating an active device array substrate, and more particularly, to a method of fabricating the active device array substrate by using a multi-tone mask.

2. Description of Related Art

Nowadays, the multimedia technology has been well developed, which mostly benefits from the development of semiconductor devices or display apparatuses. As for the display, the thin-film transistor liquid crystal display having superior features, such as high definition, good space utilization efficiency, low power consumption and no radiation, has become the mainstream of the market.

The thin-film transistor liquid crystal display mainly comprises a thin film transistor array substrate, a color filter plate and a liquid crystal layer disposed between the two substrates. The thin-film transistor array substrate is mainly formed by five mask processes. For example, in the conventional five mask processes, the first mask process mainly defines the gate and scan line; the second mask process mainly defines the channel layer; the third mask process mainly defines the source, drain, and data line; the fourth mask process mainly defines the passivation layer; and the fifth mask process mainly defines the pixel electrode. The number for performing the mask process directly influences the cost and tack time of fabricating the thin-film transistor array substrate such that companies in the industry all try to develop a method to reduce the number of the mask processes. In order to increase the throughput and lower the manufacturing cost, it is required to improve the manufacturing process of the thin-film transistor array substrate.

SUMMARY OF THE INVENTION

The purpose of the present invention is to provide a method of manufacturing an active device array substrate so as to solve the traditional problems such as higher manufacturing cost and time-consumption.

To achieve the purpose as described above, the present invention provides a method of manufacturing an active device array substrate comprising the following steps. First, a substrate and a multi-tone mask are provided, wherein the multi-tone mask has at least four transparency areas. Second, a gate electrode is formed on the substrate. Then, a gate insulation layer is formed to cover the gate electrode, and a channel material layer is formed on the gate insulation layer. A metal material layer is formed on the channel material layer. Thereafter, a photoresist layer is formed on the metal material layer. Then, the photoresist layer is patterned through the multi-tone mask such that a patterned photoresist layer is formed. The patterned photoresist layer comprises a recess and a protrusion. The part of the metal material layer is exposed outside the patterned photoresist layer. The recess is above the gate electrode correspondingly and the protrusion is near the recess. Then, a channel layer is formed by removing the metal material layer and the channel material layer not covered by the patterned photoresist layer. Next, a first removing process is performed to the photoresist layer to remove the photoresist layer at the recess to form an opening and expose part of the metal material layer. Thereafter, the metal material layer exposed to an opening is removed to form a source, a drain and the part of channel layer can be exposed. Additionally, a second removing process is performed to the patterned photoresist layer, so as to remove the patterned photoresist layer except the protrusion such that the protrusion can be on the drain. Thereafter, a protection layer is formed on the substrate to cover the top of the protrusion, part of the gate insulation layer, the source, the drain and part of the channel layer. Moreover, a third removing process is performed to remove the protrusion and the protection layer above the protrusion so that a contact window exposing the drain is formed in the protection layer. Then, a pixel electrode is formed on the substrate to fill the contact window so as to electrically connect with the drain.

According to one embodiment of the present invention, the multi-tone mask has a first transparent area, a second transparent area, a third transparent area, and a fourth transparent area. The transmittance of the first transparent area of the multi-tone mask is larger than that of the second transparent area. The transmittance of the second transparent area is larger than that of the third transparent area. The transmittance of the third transparent area is larger than that of the fourth transparent area.

According to one embodiment of the present invention, after the photoresist layer is patterned through the multi-tone mask, the metal material corresponding to the first transparent area is exposed outside the patterned photoresist layer. The recess of the patterned photoresist layer is corresponding to the second transparent area. The third transparent area is corresponding to the patterned photoresist layer except the protrusion and the recess. The protrusion of the patterned photoresist layer is corresponding to the fourth transparent area.

According to one embodiment of the present invention, the photoresist layer includes a positive photoresist.

According to one embodiment of the present invention, the multi-tone mask has a first transparent area, a second transparent area, a third transparent area, and a fourth transparent area. The transmittance of the fourth transparent area of the multi-tone mask is larger than that of the third transparent area. The transmittance of the third transparent area is larger than that of the second transparent area. The transmittance of the second transparent area is larger than that of the first transparent area.

According to one embodiment of the present invention, wherein the photoresist layer is patterned through the multi-tone mask, the metal material corresponding to the first transparent area is exposed outside the patterned photoresist layer, the recess of the patterned photoresist layer is corresponding to the second transparent area, the third transparent area is corresponding to the patterned photoresist layer except the protrusion and the recess, and the protrusion of the patterned photoresist layer is corresponding to the fourth transparent area.

According to one embodiment of the present invention, the fourth transparent area has the largest transmittance in the multi-tone mask and the photoresist material layer may include negative photoresist.

According to one embodiment of the present invention, the method of fabricating the active device array substrate further comprises forming an ohmic contact layer on the channel layer.

According to one embodiment of the present invention, the protrusion is on the end of the drain far away from the gate electrode.

According to one embodiment of the present invention, the first removing process includes ashing.

According to one embodiment of the present invention, the second removing process includes ashing.

According to one embodiment of the present invention, the third removing process includes lift-off.

The photoresist layer is patterned through the multi-tone mask in the fabrication method of active device array substrate of the present invention, so that the patterned photoresist layer has three thicknesses. Thus, the method of fabricating active device array substrate in this present invention only takes three mask processes. The fabricating cost and tack time can be effectively reduced and the throughput is greatly improved.

Reference will now be made to the present preferred embodiments of the invention, examples of which are illustrated in the accompanying drawings. Wherever possible, the same reference numbers are used in the drawings and the description to refer to the same or like parts.

DESCRIPTION OF EMBODIMENTS

First Embodiment

Figure 1A:
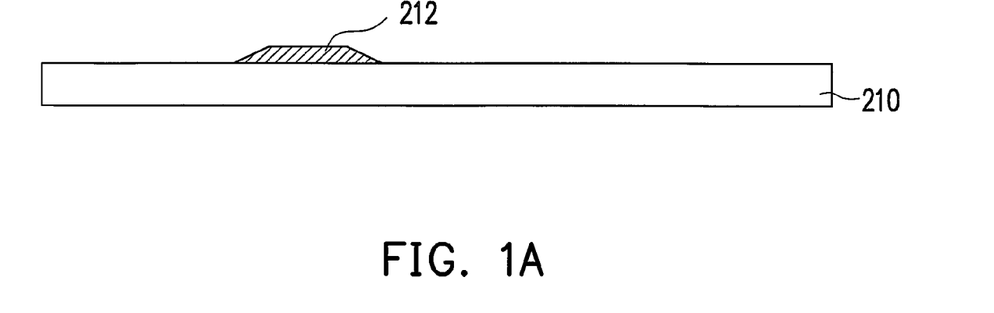
FIGS. 1A-1H and 1J-1L are schematic cross-sectional views showing the fabricating process of the active device array substrate according to the first embodiment of the present invention.

FIG. 1A-1L are schematic cross-sectional views showing the fabricating process of the active device array substrate according to the first embodiment of the present invention. Referring to FIG. 1A, a substrate 210 is provided and then a gate electrode 212 is formed thereon. Particularly, the gate electrode can be fabricated by performing a physical vapor deposition process (PVD) to deposit metal material on the substrate 210 and then the metal material is patterned through a mask process so as to form the gate electrode. The metal material can include low electrical resistance material such as aluminum, alloy thereof, gold, copper, molybdenum, alloy thereof, chromium or Ti. Generally, the scan line (not shown) and the gate electrode 212 can be formed by the same mask process.

Figure 1B:
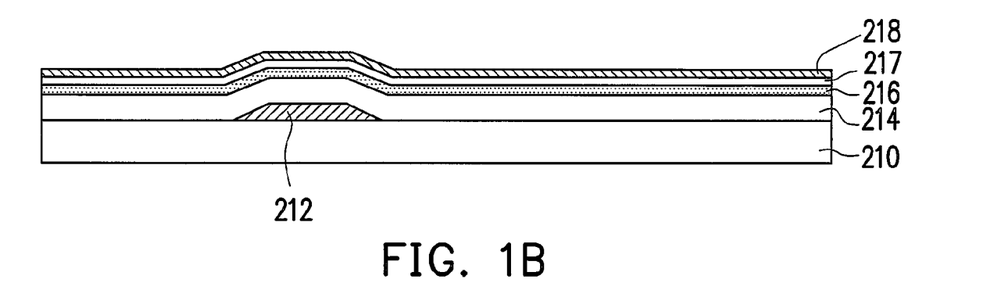

Referring to FIG. 1B, a gate insulating layer 214 is formed on the substrate 210 so as to cover the gate electrode 212 and the scan line (not shown). Particularly, the gate insulation layer 214 material can use SiN or SiO formed by using tetraethoxysilane (TEOS) as reaction gas.

Then, a channel material layer 216 is formed on the gate insulation layer 214. The channel material layer 216 can be formed by depositing amorphous silicon on the gate insulation layer in a chemical vapor disposition (CVD). Generally, in order to reduce contact resistant between the channel material layer 216 and the metal material, in practice a doped semiconductor layer 217 can be formed on the channel material layer 216. The material thereof may be an N-typed doped amorphous silicon, for example. Afterward, a metal material layer 218 is formed on the channel material layer 216.

Figure 1C:
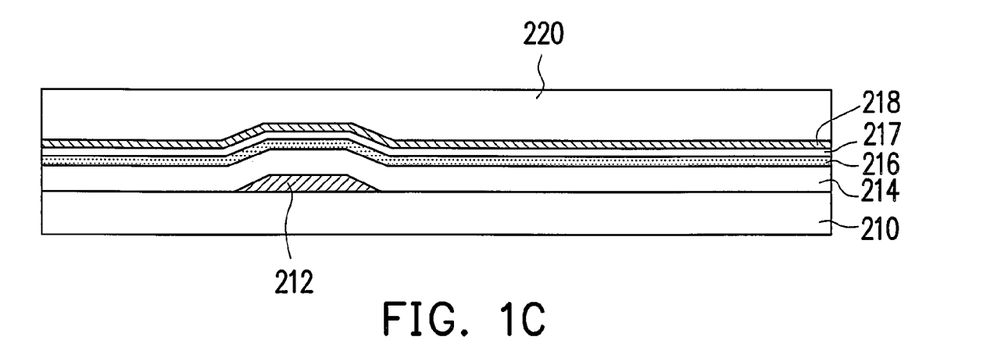
Figure 1D:
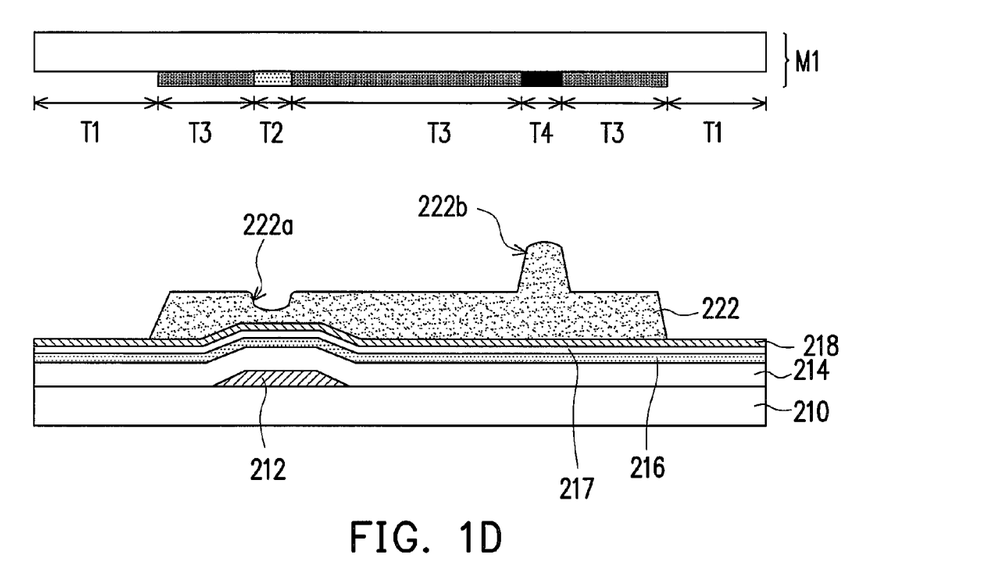

Referring to FIG. 1C, a photoresist layer 220 is formed on the metal material layer 218. In this embodiment, the photoresist layer is positive photoresist. The photoresist layer certainly can be negative photoresist, which will be explained in detail in the third embodiment. Referring to FIG. 1D, a multi-tone mask M1 is provided, wherein M1 has at least 4 transparent areas. For example, the multi-tone mask M1 of the present invention may have a first transparent area T1, a second transparent area T2, a third transparent area T3 and a fourth transparent area T4. The transmittance of the first transparent area T1 of the multi-tone mask M1 is larger than that of the second transparent area T2. The transmittance of the second transparent area T2 is larger than that of the third transparent area T3. The transmittance of the third transparent area T3 is larger than that of the fourth transparent area T4. In this embodiment, the fourth transparent area T4 may be a non-transparent area.

Then, the photoresist layer 220 is patterned by the multi-tone mask M1 so as to form a patterned photoresist layer 222. It should be noted that, the multi-tone mask M1 has four different transmittance such that the photoresist layer 222 formed by patterning the photoresist layer 220 will have three different thicknesses. The transmittance of the first transparent area Ti is largest and the photoresist layer 220 is positive photoresist, such that the photoresist layer 220 corresponding to the first transparent area T1 is removed after being patterned. Thus, the metal material 218 corresponding to the first transparent area T1 is exposed outside the patterned photoresist layer 222. On the other hand, the fourth transparent area T4 is non-transparent in this embodiment, so the photoresist layer 220 corresponding to T4 is not removed.

Particularly, the patterned photoresist layer 222 has a recess 222a and a protrusion 222b. The recess 222a is above the gate electrode 212 correspondingly and the protrusion 222b is near the recess 222a.

As shown in FIG. 1D, the second transparent area T2 is corresponding to the recess 222a of the patterned photoresist layer 222, the third transparent area T3 is corresponding to the patterned photoresist layer 222 except the recess 222a and the protrusion 222b, and the protrusion 222b of the patterned photoresist layer 222 is corresponding to the fourth transparent area T4.

Figure 1E:
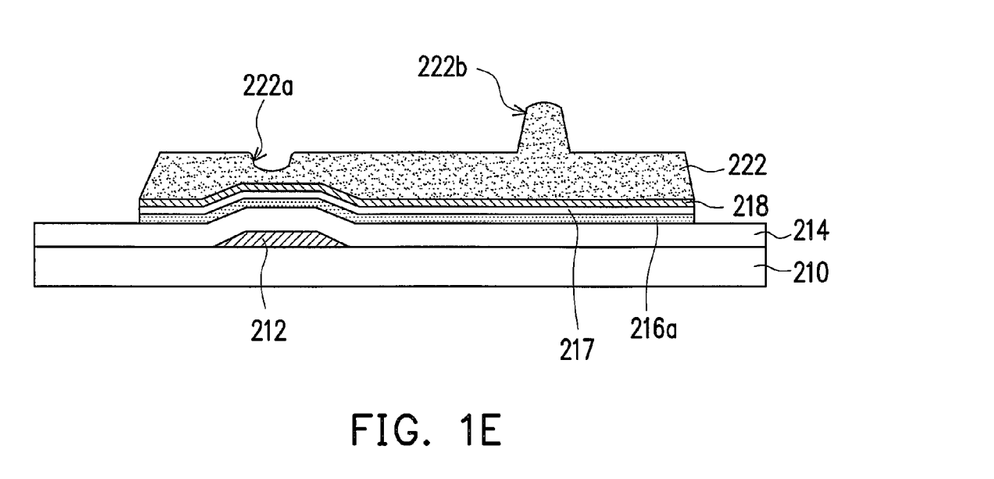
Figure 1F:
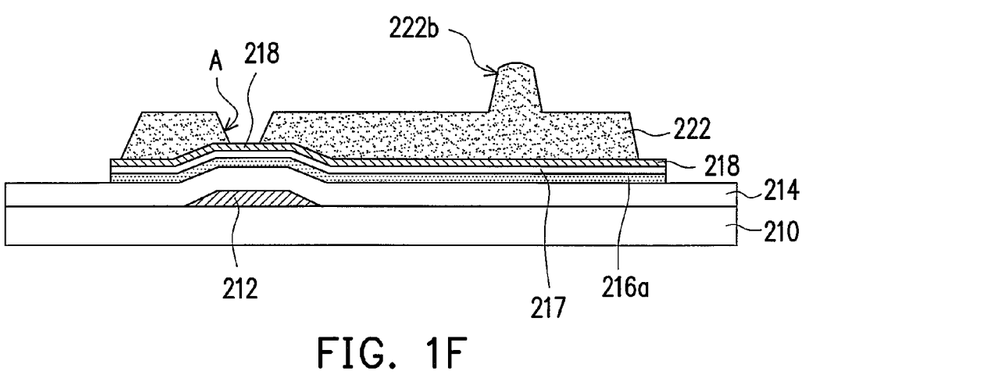

Referring to FIG. 1E, the metal material layer 218, doped semiconductor layer 217 and channel material layer 216 which are not covered by the patterned photoresist layer 222 are removed by an etching process so as to form a channel layer 216a. Referring to FIG. 1F, a first removing process is performed to the patterned photoresist layer 222. The process is ashing, for example, to remove the patterned photoresist layer 222 at the recess 222a so as to form an opening A exposing part of the metal material layer 218. Particularly, the method for removing photoresist material may have a dry photoresist removing method and a wet photoresist removing method. In the present invention, an ashing process is performed in the first removing process that is a dry photoresist removing method. In the dry photoresist removing method, the oxygen or C—F based gas is used as a reaction gas and a bias voltage is applied so as to produce a plasma. The patterned photoresist layer 222 can be removed in anisotropic way by using the plasma.

Figure 1G:
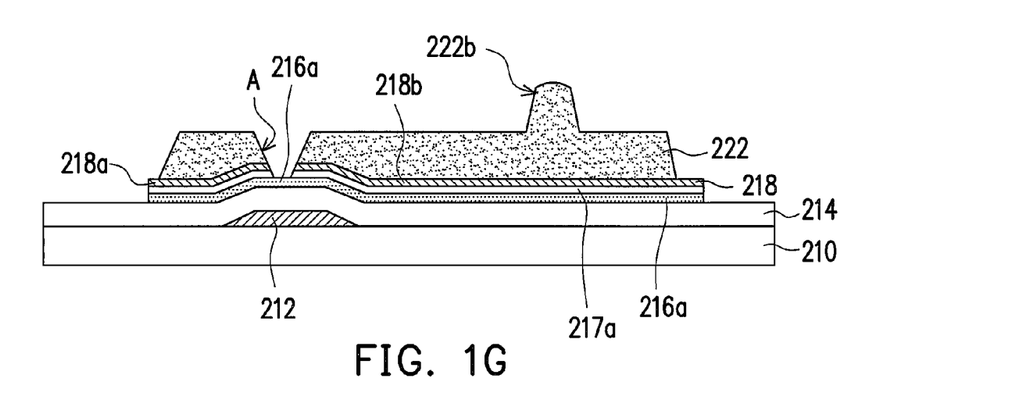

Referring to 1G, an etching process is performed to remove the metal material layer 218 exposed to the opening A and part of the doped semiconductor layer 217 so that a source 218a, a drain 218b and an ohm contact layer 217a are formed. Generally, the data line (not shown), the source 218a and drain 218b can be fabricated together. In addition, the opening A can expose part of the channel layer 216a.

Figure 1H:
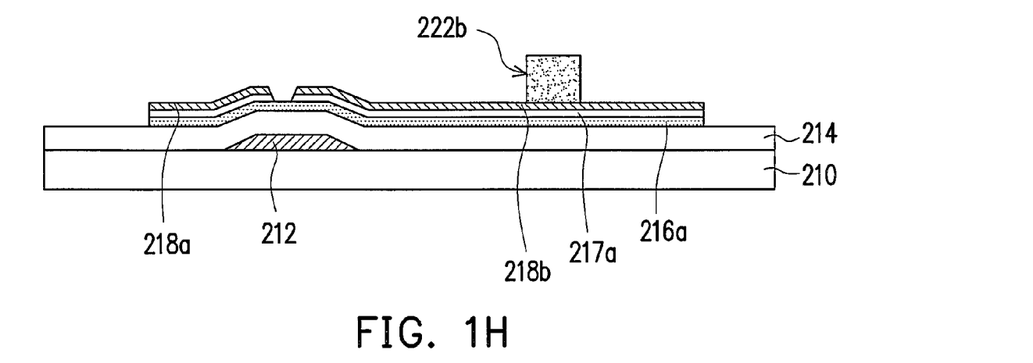
Figure 1J:
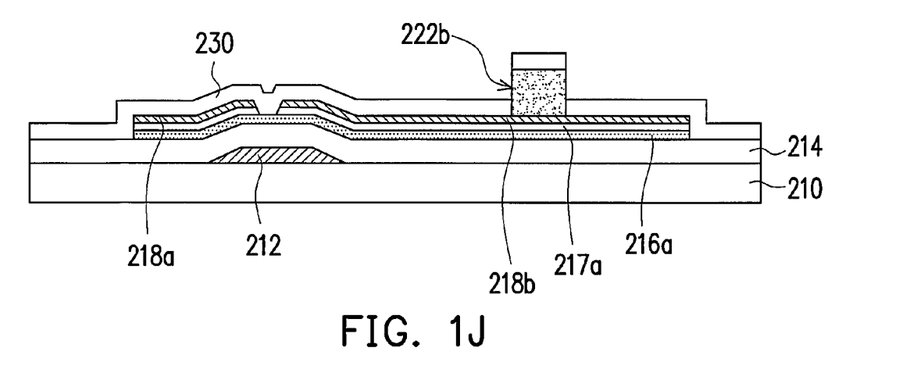

Referring to FIG. 1H, a second removing process is performed to the photoresist layer 222 to remove the patterned photoresist layer 222 outside the protrusion 222b so that the protrusion 222b is formed on the drain 218b. The second removing process may be the ashing process. It should be noted that, the increase of the bias voltage in the ashing process can make the side wall of the protrusion vertical approximately. Referring to FIG. 1J, a protection layer 230 is formed on the substrate 210 to cover the top of the protrusion 222b, part of the gate insulation layer 214, the source 218a, the drain 218b and part of the channel layer 216a. It should be noted that, the side wall of the protrusion 222b is vertical approximately and high enough such that the protection layer 230 is hard to be formed on the side wall of the protrusion 222b.

Figure 1K:
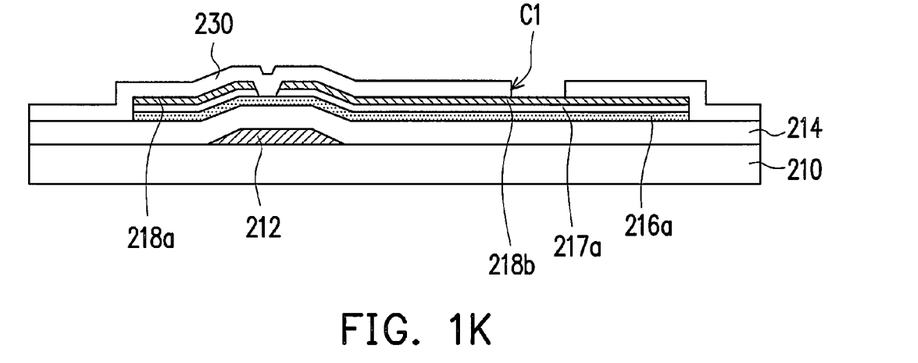

Referring to FIG. 1K, a third removing process is performed to remove the protrusion 222b and at the same time to remove the protection layer 230 above the protrusion 222b so as to form a contact window C1 in the protection layer 230, and then part of the drain 218b can be exposed. The third removing method may be lift-off process. It should be noted that, the protection layer 230 is hard to be formed on the side wall of the protrusion 222b such that the side wall thereof can be exposed outside. The protrusion 222b can be effectively removed by the application of appropriate photoresist remover. In other words, there is no photoresist residue nearly in the contact window C1. That can make the pixel electrode formed subsequently to fill the contact window C1 effectively so as to avoid the contact fault between the pixel electrode and the drain 218b.

Particularly, in the present invention, the multi-tone mask M1 is used in the method of fabricating an active device array substrate, such that the channel layer 216a, the source 218a, the drain 218b and the protection layer 230 can be formed by performing a mask process only as shown in FIGS. 1B-1K. Traditionally, three mask process are needed to complete manufacturing the channel layer 216a, the source 218b and the protection layer 230. However, the method of fabricating active device array substrate of the presentation invention can reduce the manufacturing cost greatly and tack time so as to enhance the throughput.

Figure 1L:
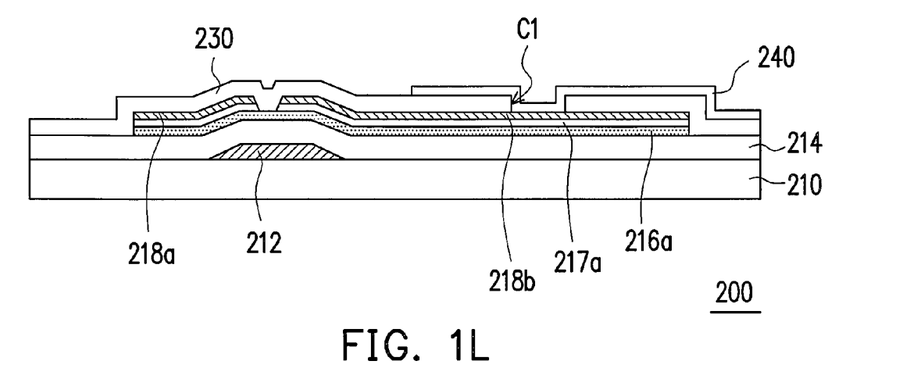

Referring to FIG. 1L, a pixel electrode 240 is formed on the substrate 210 to cover the protection layer 230. Additionally, the pixel electrode 240 fills the contact window C1 and is electrically connected with the drain 218b. Particularly, the material such as ITO, IZO or AZO can be deposited on the protection layer 230 and filled the contact window C1. Thereafter, a mask process is performed to the material, and then the pixel electrode can be fabricated. In summary, the active device array substrate 200 of the present invention can be fabricated by performing only three mask processes with the proper removing process.

Second Embodiment

The second embodiment is similar to the first embodiment. The main difference is that the arrangement of the transparent area of the multi-tone mask used in the second embodiment differs from that of the multi-tone mask shown in ID. Referring to FIGS. 1A-1C, in this embodiment the initial fabricating steps are similar to those described in FIGS. 1A-1C. The description of the steps is omitted.

Figure 2A:
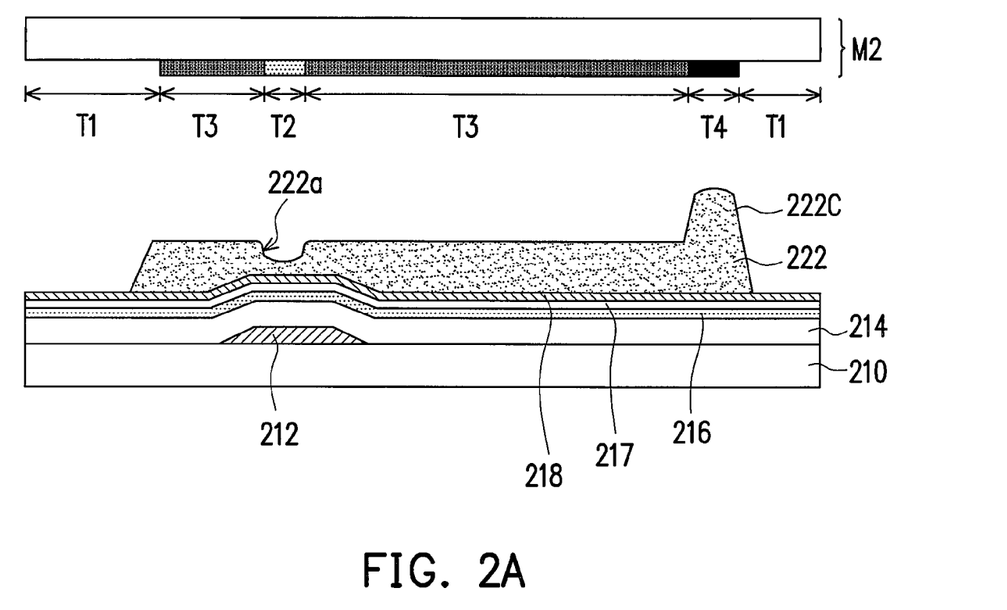
FIGS. 2A-2H are schematic cross-sectional views showing the fabricating process of the active device array substrate according to the second embodiment of the present invention.

Referring to FIG. 2A, a multi-tone mask M2 is provided, wherein the fourth transparent area T4 with the lowest transmittance is disposed outside the third transparent area T3; and the fourth transparent area T4 is next to the first transparent area T1 with the highest transmittance. Accordingly, the protrusion 222c is formed on the outside of the patterned photoresist layer 222 after the photoresist layer 220 has been patterned.

Figure 2B:
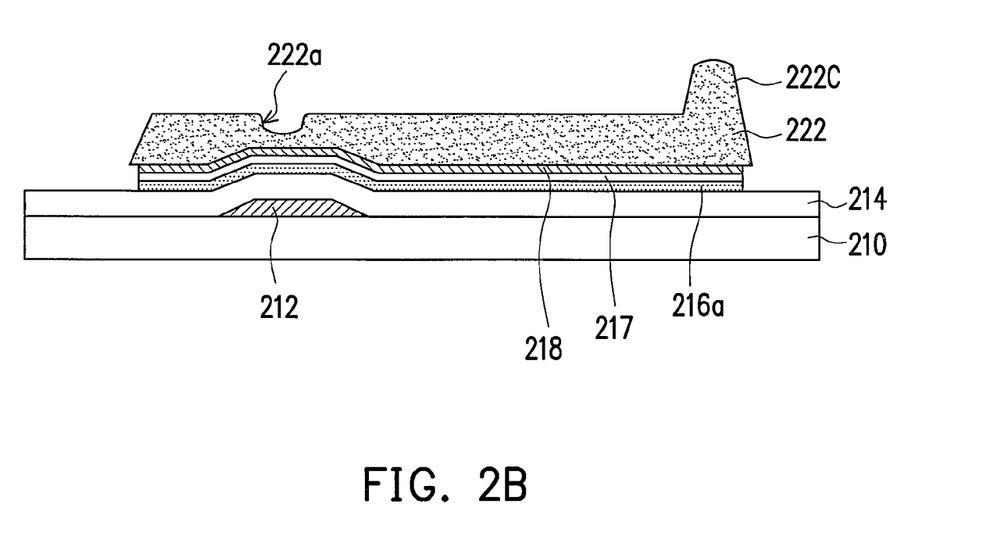

Referring to FIG. 2B, an etching process is performed so that the metal material layer 218, the doped semiconductor layer 217 and the channel material layer 216 which are not covered by the patterned photoresist layer 222 are removed so as to form a channel layer 216a. It is noted that in the removing process, over etching is occurred in the channel layer 216a, the doped semiconductor layer 217 and the metal material layer 218. As shown in FIG. 2B, overhead occurs on the edge of the patterned photoresist layer 222.

Figures 2C, 2D:
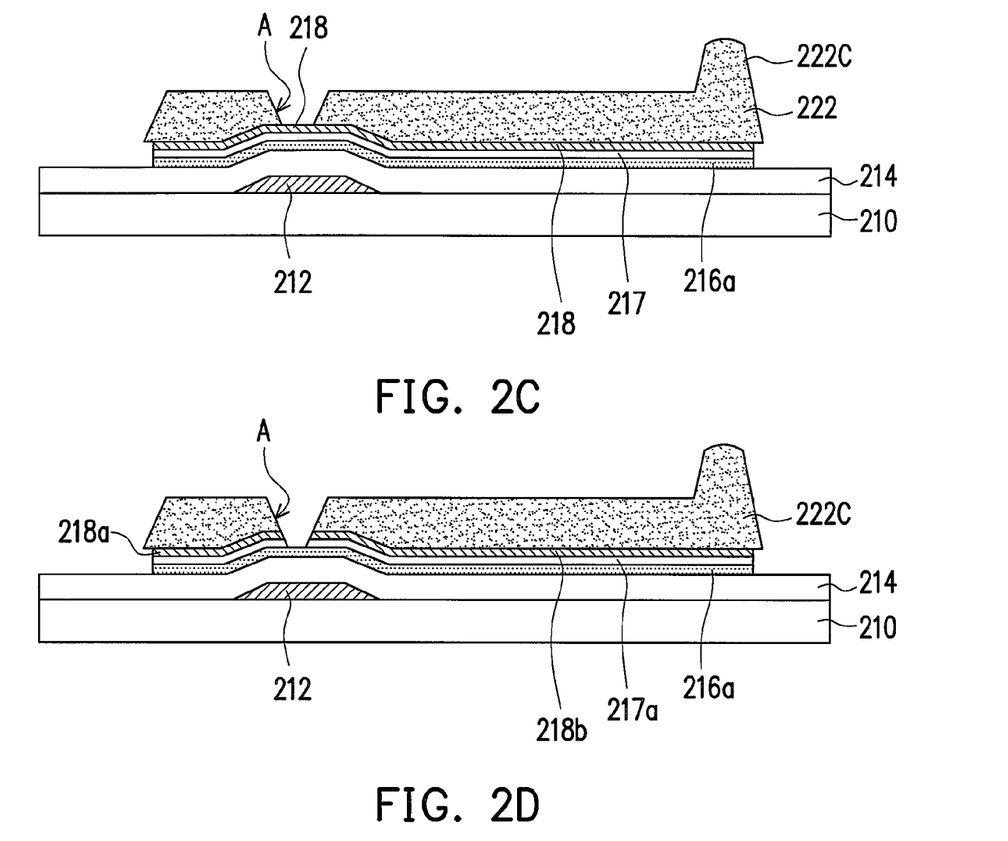

Referring to FIG. 2C, a first removing process is performed to the patterned photoresist layer 222. The process may be ashing to remove the patterned photoresist layer 222 at the recess 222a so that an opening A is formed. Additionally, part of the metal material layer 218 is exposed to the opening A.

Referring to FIG. 2D, an etching process is performed to remove the metal material layer 218 exposed to the opening A and part of the doped semiconductor layer 217 so that a source 218a, a drain 218b and an ohm contact layer 217a are formed. Generally, the data line (not shown), the source 218a and the drain 218b can be fabricated together. Also, part of the channel 216a can be exposed to the opening A.

Figure 2E:
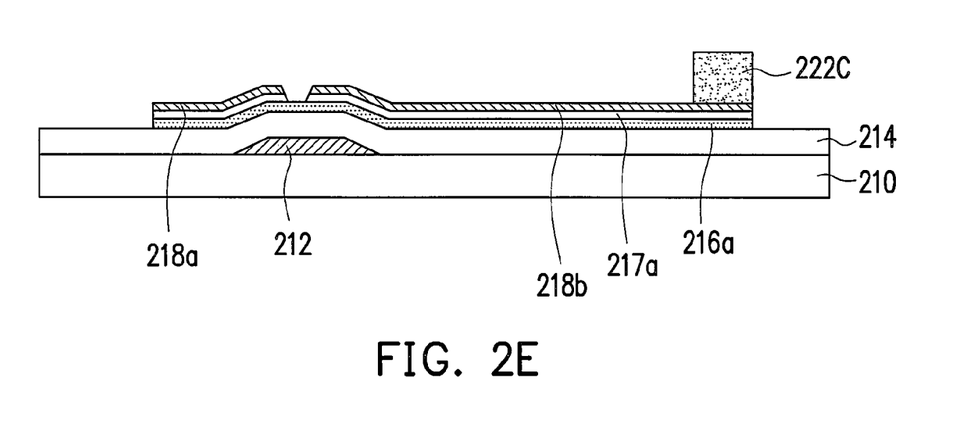

Referring to FIG. 2E, a second removing process is performed to the patterned photoresist layer 222. For example an ashing process can be adopted to remove the patterned photoresist layer 222 except the protrusion 222c so that the protrusion 222c is formed on the one end of the drain 218b far away from the gate electrode 212. It should be noted that the increase of the bias voltage in the ashing process can make the side wall of the protrusion vertical approximately.

Figure 2F:
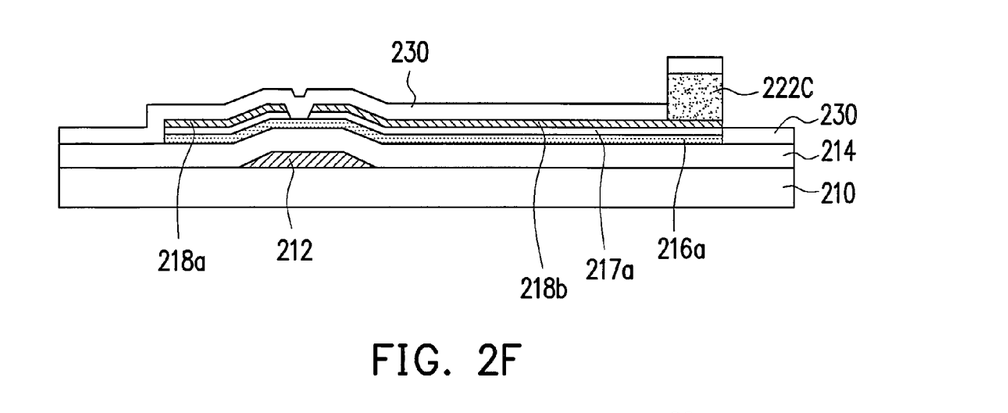

Referring to FIG. 2F, a protection layer 230 is formed on the substrate 210 to cover the top of the protrusion 222c, part of the gate insulation layer 214, the source 218a, the drain 218b and part of the channel layer 216a. It should be noted that, the side wall of the protrusion 222c is quite vertical and the protrusion 222c is formed on the outside of the drain 218b such that there will be a quite difference in height between the protrusion 222c and the protection layer 230 located on the gate insulation layer 214. Thus, the protection layer 230 is hard to be attached to the side wall of the protrusion 222c, which is good for performance of the subsequent lift-off process.

Figure 2G:
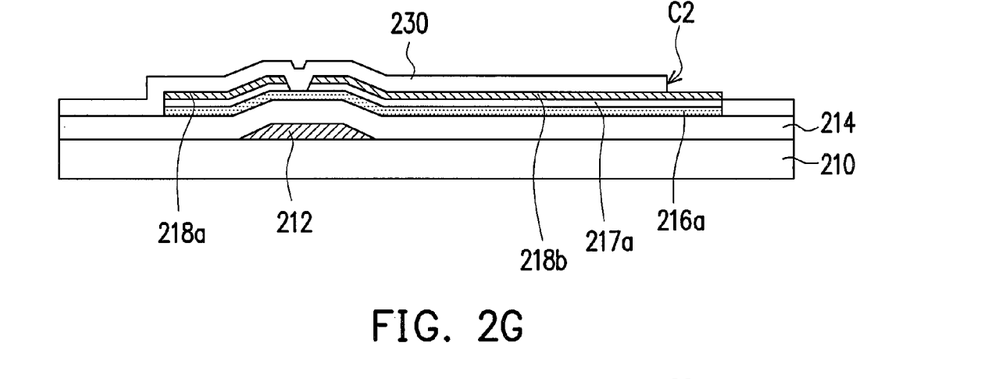

Referring to FIG. 2G, a third removing process is performed to remove the protrusion 222c and at the same time to remove the protection layer 230 above the protrusion 222c so that a contact window C2 is formed in the protection layer 230 and part of the drain 218b is exposed. The third removing process may be a lift-off process. The protection layer 230 is hard to be attached on the side wall of the protrusion 222c such that the side wall thereof is exposed outside. The protrusion 222c can be effectively removed by using the proper photoresist remover. In this way, the photoresist will not remain in the contact window C2.

Figure 2H:
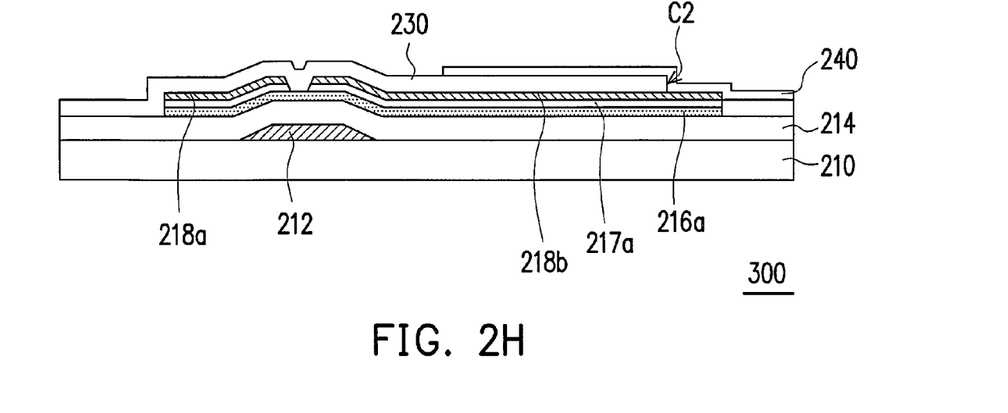

Referring to FIG. 2H, a pixel electrode 240 is formed on the substrate 210 to cover the protection layer 230 and fills the contact window C2 so that the drain 218 is electrically connected. Because the photoresist is hard to remain in the contact window C2, the pixel electrode 240 can effectively fills in the contact window C2 to further avoid the contact fault between the pixel electrode 240 and the drain 218b.

Particularly, the material such as ITO, IZO or AZO can be deposited on the protection layer 230. Thereafter, a mask process is performed to the material, and then the pixel electrode 240 can be fabricated.

Third Embodiment

The third embodiment is similar to the first embodiment. The difference is that in the third embodiment the material for the photoresist layer 220 is the negative photoresist. Furthermore, the transmittance of each transparent area of the accompanying multi-tone mask is properly adjusted. First, referring to FIGS. 1A-1C. In this embodiment, the initial fabricating steps are similar to those described in FIGS. 1A-1C. The description of the steps is omitted.

Figure 3A:
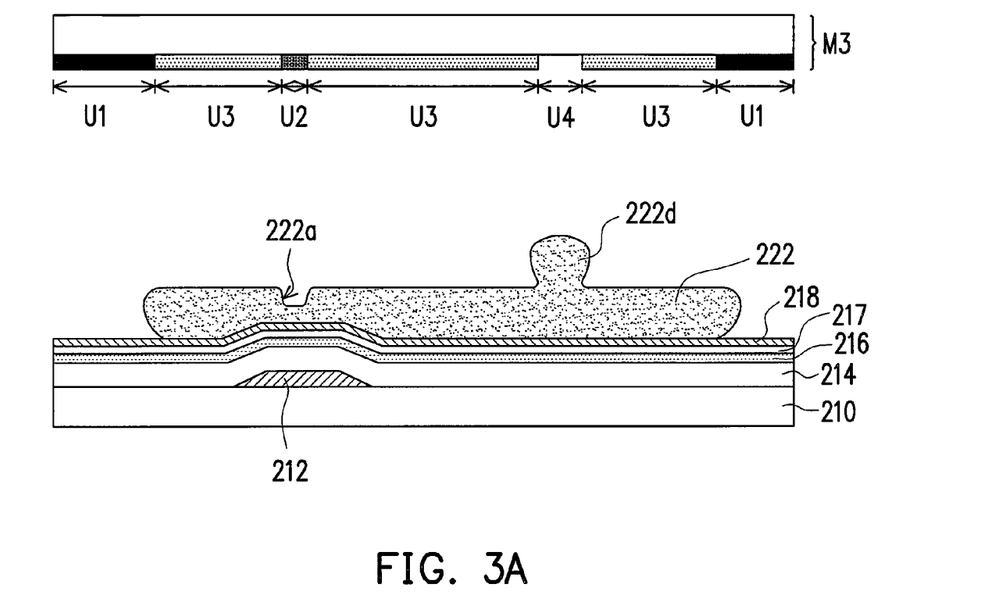
FIGS. 3A-3H are schematic cross-sectional views showing the fabricating process of the active device array substrate according to the third embodiment of the present invention.

Referring to FIG. 3A, a multi-tone mask M3 is provided, wherein the multi-tone mask M3 has a first transparent area U1, a second transparent area U2, a third transparent area U3 and a fourth transparent area U4. The transmittance of fourth transparent area U4 of multi-tone mask M3 is larger than that of the third transparent area U3. The transmittance of the third transparent area U3 is larger than that of the transparent area U2. The transmittance of the transparent area U2 is larger than that of the first transparent area U1. In this embodiment, the first transparent area U1 may be a non-transparent area. Next, the photoresist layer 220 is patterned through the multi-tone mask M3 such that the metal material 218 corresponding to the first transparent area U1 is exposed outside the patterned photoresist layer 222. Moreover, the recess 222a of the patterned photoresist layer 222 is corresponding to the second transparent area U2, the third transparent area U3 is corresponding to the patterned photoresist layer 222 except the recess 222a and the protrusion 222d. The protrusion 222d thereof is corresponding to the fourth transparent area U4.

As shown in FIG. 3A, the protrusion 222d of the patterned photoresist layer 222 may be an inverted triangle shaped. That is because the material of the patterned photoresist layer is the negative typed photoresist and in the patterning process the photoresist layer 220 is influenced by diffraction.

Figure 3B:
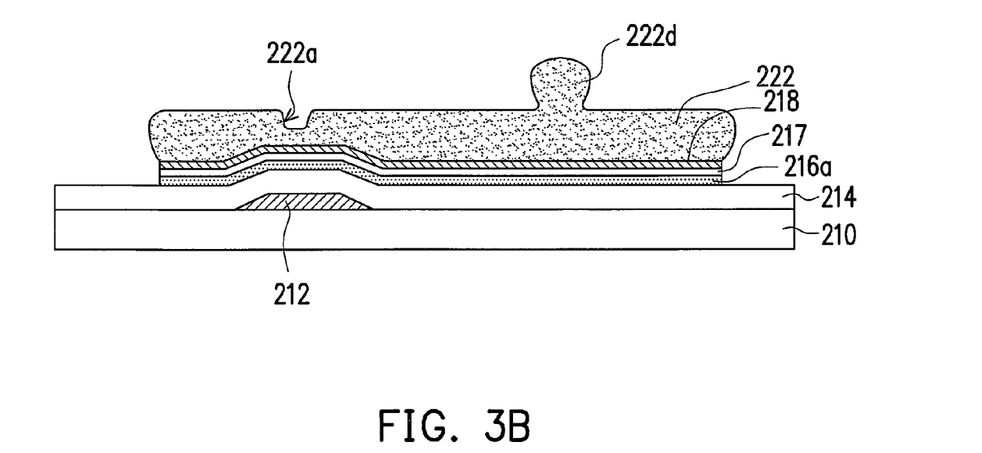

Referring to FIG. 3B, an etching process is performed so that the metal material layer 218, the doped semiconductor layer 217 and the channel material layer 216 which are not covered by the patterned photoresist layer 222 are removed so as to form a channel layer 216a.

Figure 3C:
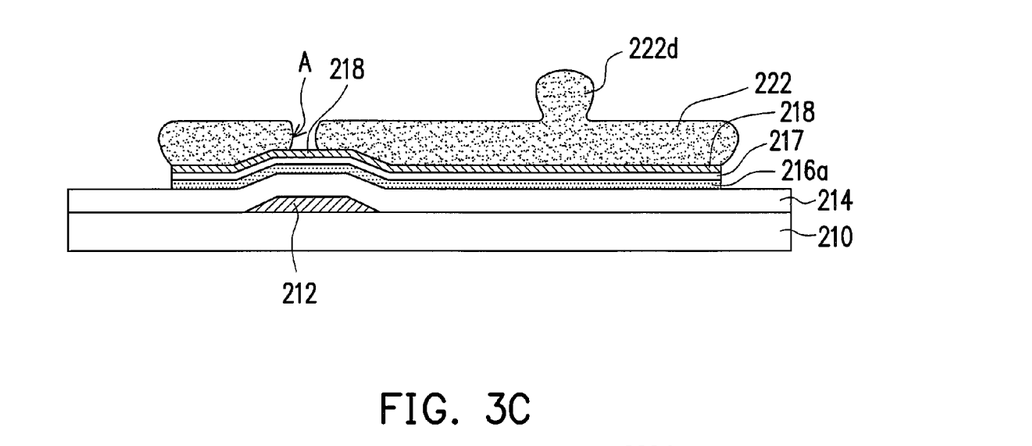
Figure 3D:
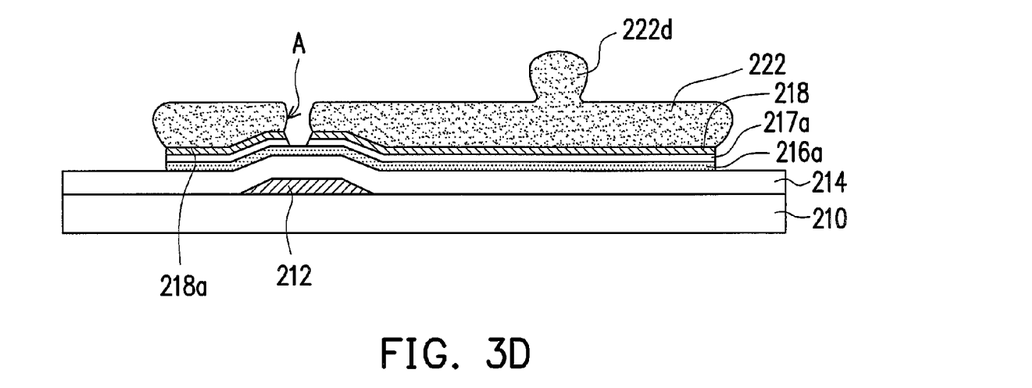

Referring to FIG. 3C, a first removing process is performed to the patterned photoresist layer 222. The process may be ashing to remove the patterned photoresist layer 222 at the recess 222a so that an opening A is formed. Additionally, part of the metal material layer 218 is exposed to the opening A. Then, referring to 3D, an etching process is performed to remove the metal material layer 218 exposed to the opening A and part of the doped semiconductor layer 217 so that a source 218a, a drain 218b and an ohm contact layer 217a are formed. Generally, the data line (not shown), the source 218a and the drain 218b can be fabricated together. Also, part of the channel 216a can be exposed to the opening A.

Figure 3E:
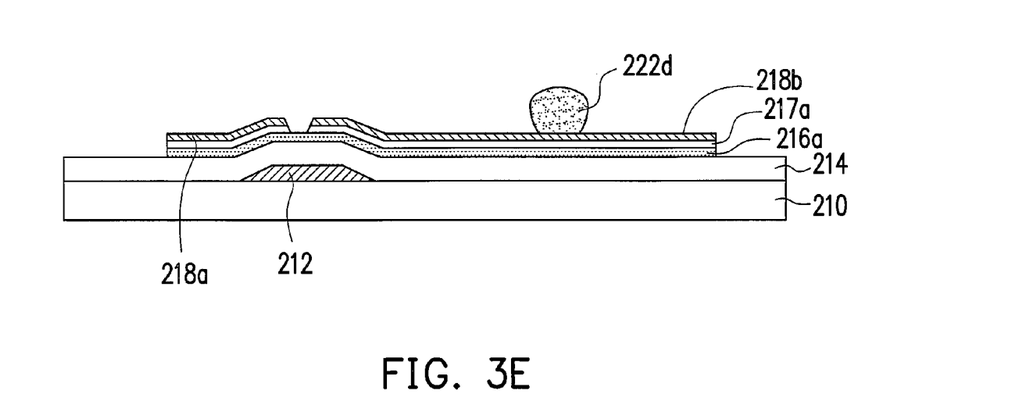

Referring to FIG. 3E, a second removing process is performed to the photoresist layer 222 to remove the patterned photoresist layer 222 outside the protrusion 222d so that the protrusion 222d is formed on the drain 218b. The second removing process may be the ashing process. It should be noted that, in the ashing process a lower bias voltage is applied to so the protrusion 222d in the inverted triangle shape can be maintained. In this embodiment, each transparent area of the multi-tone mask M3 in the method of fabricating active device array substrate may be adjusted so that the protrusion 222d is formed on the one end of the drain 218b far away from the gate electrode 212.

Figure 3F:
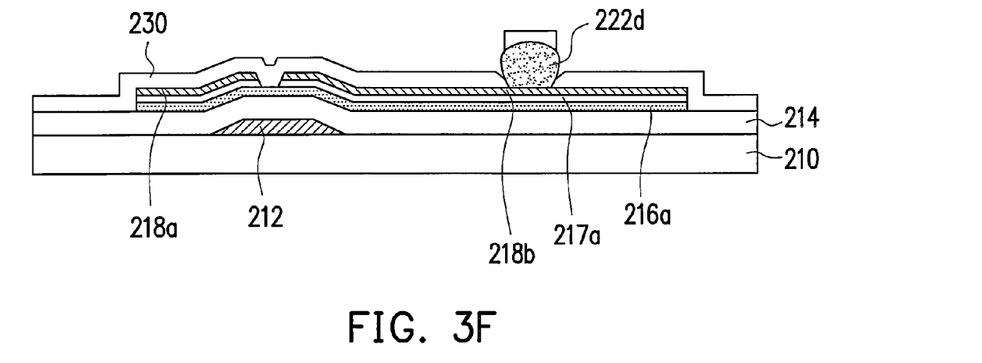

Referring to FIG. 3F, a protection layer 230 is formed on the substrate 210 to cover the top of the protrusion 222d, part of the gate insulation layer 214, the source 218a, the drain 218b and part of the channel layer 216a. It should be noted that the protrusion 222d is an inverted triangle so that the protection layer 230 is hard to be attached to the side wall of the protrusion 222d, which is good for performance of the subsequent lift-off process.

Figure 3G:
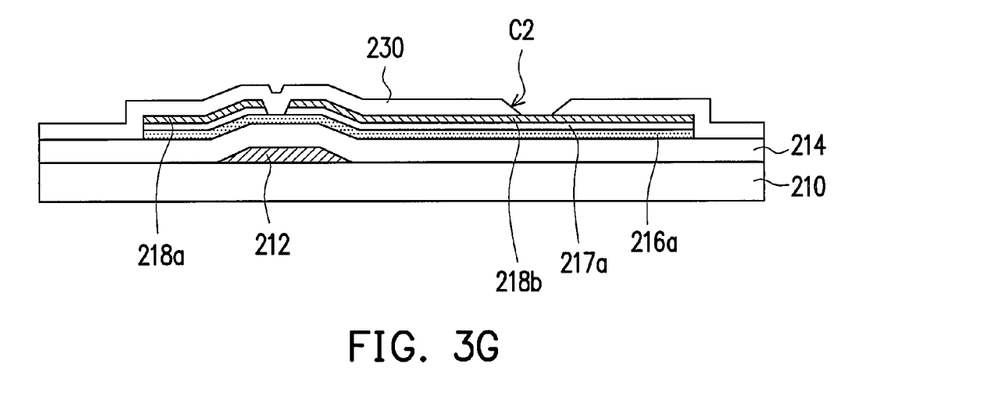

Referring to FIG. 3G, a third removing process, the lift-off process, is performed to remove the protrusion 222d and at the same time to remove the protection layer 230 above the protrusion 222d so that a contact window C2 is formed in the protection layer 230 and part of the drain 218b is exposed. The protrusion 222d is inverted triangle shaped such that the protection layer 230 is hard to be formed on the side wall of protrusion 222d. Thus, the side wall of the protrusion 222d is exposed outside. Some proper photoresist remover can be used to effectively remove the protrusion 222d so that the photoresist does not remain in the contact window C2.

Figure 3H:
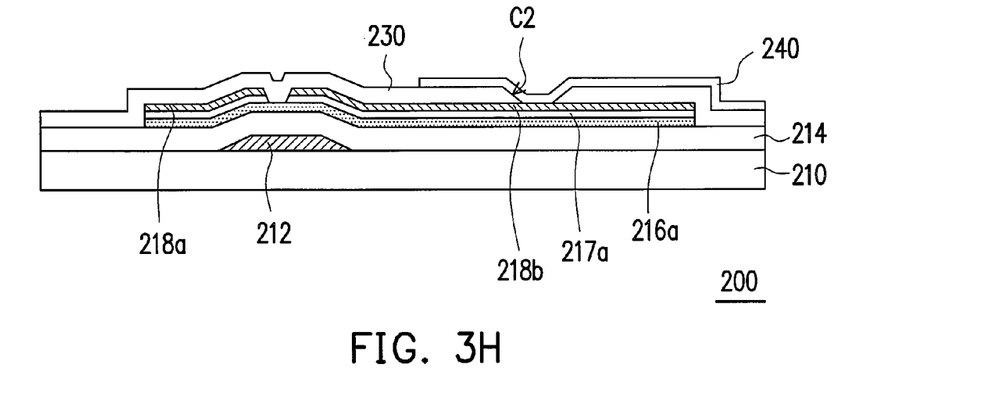

Referring to FIG. 3H, a pixel electrode 240 is formed on the substrate 210 to cover the protection layer 230. Additionally, the pixel electrode 240 fills the contact window C2 and is electrically connected with the drain 218b. The photoresist is hard to remain in the contact window C2 such that the pixel electrode 240 can be effectively filled the contact window C2 to further avoid the contact fault between the pixel electrode 240 and the drain 218b. Particularly, material such as ITO, IZO or AZO can be deposited on the protection layer 230. Thereafter, a mask process is performed to the material, and then the pixel electrode 240 can be fabricated.

In summary, the photoresist layer is patterned through the multi-tone mask in the fabrication method of active device array substrate of the present invention, so that the patterned photoresist layer has three thicknesses. Then, the channel layer, the source and the protection layer can be fabricated in one mask process with the proper removing process. Thus, the method of fabricating an active device array substrate according to the present invention only takes three mask processes. In this way, the fabricating cost and tack time can be effectively reduced so as to improve the throughput.

The above description provides a full and complete description of the preferred embodiments of the present invention. Various modifications, alternate construction, and equivalent may be made by those skilled in the art without departing from the scope or spirit of the invention. Accordingly, the above description and illustrations should not be construed as limiting the scope of the invention which is defined by the appended claims.

What is claimed is:

1. A method of fabricating active device array substrate, comprising:
    providing a substrate and a multi-tone mask, wherein the multi-tone mask has at least four transparent areas;
    forming a gate electrode on the substrate;
    forming a gate insulation layer on the substrate to cover the gate electrode;
    forming a channel material layer on the gate insulation layer;
    forming a metal material layer on the channel material layer;
    forming a photoresist layer on the metal material layer and patterning the photoresist layer through the multi-tone mask so as to form a patterned photoresist layer, wherein the patterned photoresist layer has a recess and a protrusion with part of the metal material layer exposed outside the patterned photoresist layer, wherein the recess is above the gate electrode correspondingly and the protrusion is adjacent to the recess;

removing the metal material layer and the channel material layer, uncovered by the patterned photoresist layer, to form a channel layer;

performing a first removing process to remove the patterned photoresist layer at the recess so as to form an opening and expose part of the metal material layer;

removing the metal material layer exposed to the opening to form a source and a drain and expose part of the channel layer;

performing a second removing process to remove the patterned photoresist layer except the protrusion so that the protrusion can be on the drain;

forming a protection layer on the substrate to cover the top of the protrusion, part of the gate insulating layer, the source, the drain, and part of the channel layer;

performing a third removing process to remove the protrusion and the protection layer above the protrusion so that a contact window is formed in the protection layer with the exposure of part of the drain; and forming a pixel electrode on the substrate to fill the contact window so as to electrically connect with the drain.

2. The method as claimed in claim 1, wherein the multi-tone mask has a first transparent area, a second transparent area, a third transparent area and a fourth transparent area, the transmittance of the first transparent area of the multi-tone mask is larger than that of the second transparent area, the transmittance of the second transparent area is larger than that of the third transparent area, and the transmittance of the third transparent area is larger than that of the fourth transparent area.

3. The method as claimed in claim 2, wherein after the photoresist layer is patterned through the multi-tone mask, the metal material layer corresponding to the first transparent is exposed outside the patterned photoresist layer, and wherein the recess of the patterned photoresist layer is corresponding to the second transparent area, the third transparent area is corresponding to the patterned photoresist layer except the recess and the protrusion, and the protrusion of the pattern photoresist layer is corresponding to the fourth transparent area.

4. The method as claimed in claim 2, wherein the photoresist layer includes positive photoresist.

5. The method as claimed in claim 1, wherein the multi-tone mask has a first transparent area, a second transparent area, a third transparent area and a fourth transparent area, and wherein the transmittance of the fourth transparent area of the multi-tone mask is larger than that of the third transparent area, the transmittance of the third transparent area is larger than that of the second transparent area, and the transmittance of the second transparent area is larger than that of the first transparent area.

6. The method as claimed in claim 5, wherein after the photoresist layer is patterned through the multi-tone mask, the metal material layer corresponding to the first transparent area is exposed outside the patterned photoresist layer, and wherein the recess of the patterned photoresist layer is corresponding to the second transparent area, the third transparent area is corresponding to the patterned photoresist layer except the recess and the protrusion, and the protrusion is corresponding to the fourth transparent area.

7. The method as claimed in claim 5, wherein the photoresist layer includes negative photoresist.

8. The method as claimed in claim 1, further comprising forming an ohmic contact layer on the channel layer.

9. The method as claimed in claim 1, wherein the protrusion is on the end of the drain far away from the gate electrode.

10. The method as claimed in claim 1, wherein the first removing process includes ashing.

11. The method as claimed in claim 1, wherein the process of removing the metal material layer includes etching.

12. The method as claimed in claim 1, wherein the second removing process includes ashing.

13. The method as claimed in claim 1, wherein the third removing process includes lift-off.

* * * * *